United States Patent [19]
Kotowski et al.

[11] Patent Number: 5,561,660
[45] Date of Patent: Oct. 1, 1996

[54] OFFSET AND PHASE CORRECTION FOR DELTA-SIGMA MODULATORS

[75] Inventors: Jeff Kotowski, Nevada City; Richard D. Davis, Aliso Viejo, both of Calif.

[73] Assignee: Silicon Systems, Inc., Tustin, Calif.

[21] Appl. No.: 416,614

[22] Filed: Apr. 5, 1995

[51] Int. Cl.$^6$ .............................. H03L 7/00; H03M 3/02
[52] U.S. Cl. .............................. 370/12; 375/247; 375/376
[58] Field of Search .............................. 370/12, 105.3; 375/373, 375, 376, 344, 340, 342, 343, 247, 248

[56] References Cited

U.S. PATENT DOCUMENTS 4,862,485  8/1989  Guinea et al. .............................. 375/376
4,888,790 12/1989  Wong et al. .............................. 375/342
5,457,714 10/1995  Engel et al. .............................. 375/247

*Primary Examiner*—Wellington Chin
*Attorney, Agent, or Firm*—Hecker & Harriman

[57] ABSTRACT

The present invention discloses method and apparatus for offset and phase correction in multiplexed delta-sigma modulators. According to the invention, offsets and phases of input signals to multiplexed delta-sigma modulators are corrected by a simple and low cost method. The invention utilizes a novel switching technique during different sampling periods to eliminate the effect of DC offsets present in multiplexed input signals. The invention also uses a delay introduced by a FIFO or a shift register to individually correct for phase shifts present in individual multiplexed input signals. The invention accomplishes these objectives without introducing a significant quantization noise, and without requiring overlapping FIR filters.

22 Claims, 3 Drawing Sheets

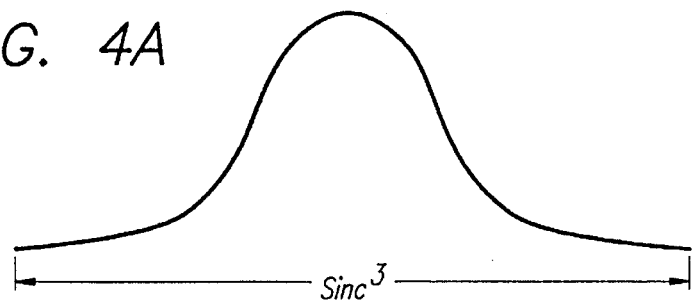
FIG. 4A
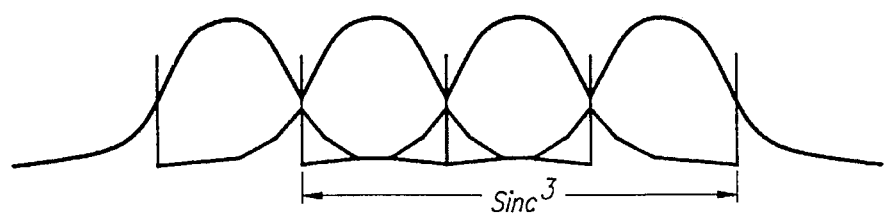
FIG. 4B
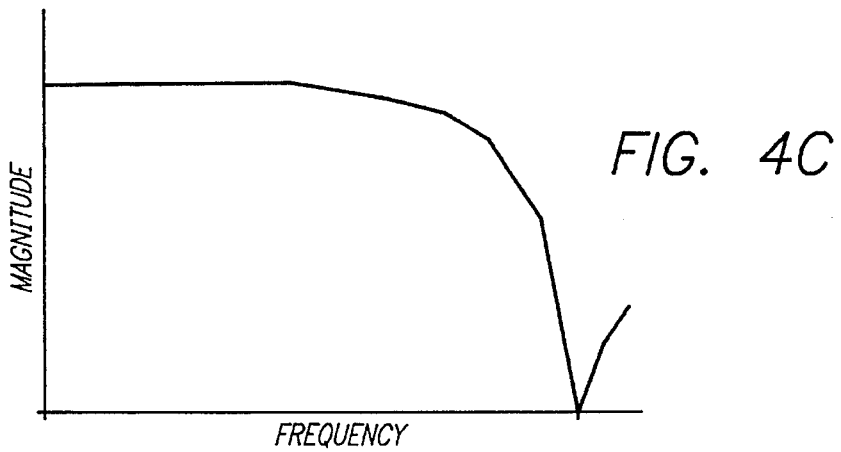
FIG. 4C
FIG. 5
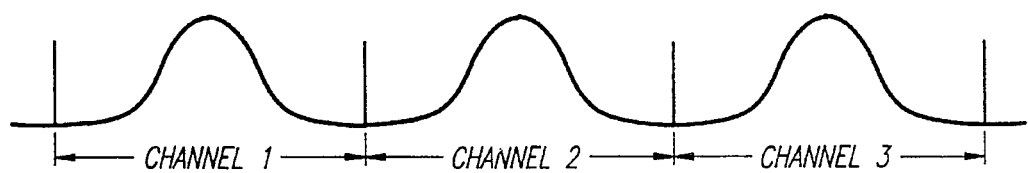

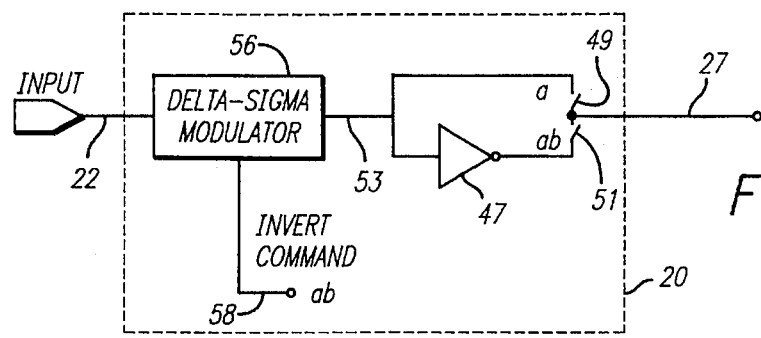
FIG. 6
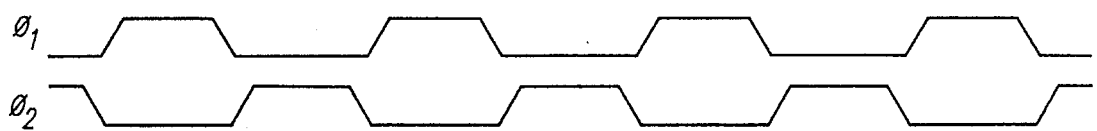
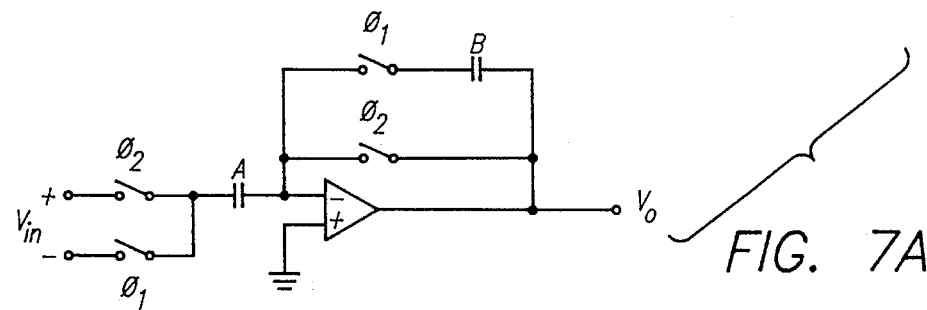
FIG. 7A
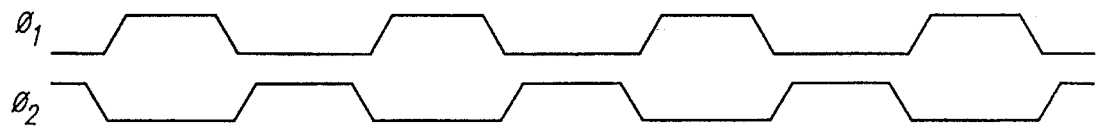
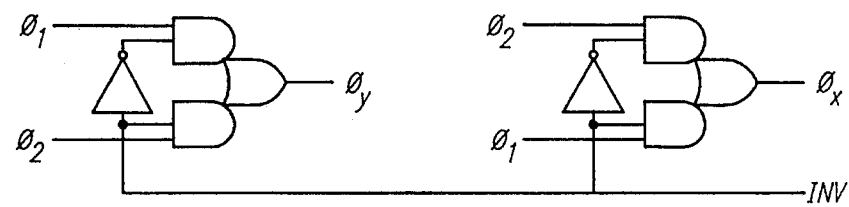
FIG. 7B
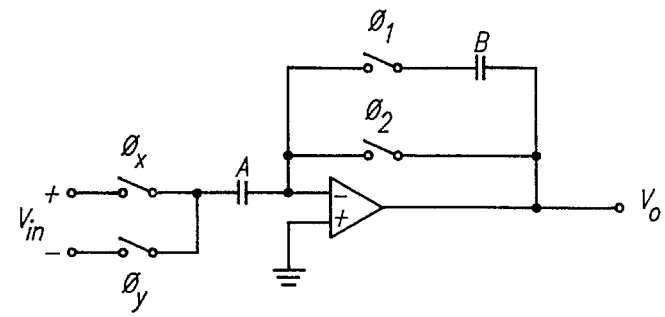

OFFSET AND PHASE CORRECTION FOR DELTA-SIGMA MODULATORS

BACKGROUND OF THE INVENTION

1. Field of the Invention

The present invention relates to the field of delta-sigma modulators. In particular, the invention relates to method and apparatus for adjusting phase and offset for multiplexed and non-multiplexed delta-sigma modulators.

2. Background Art

One of the fundamental factors in the performance of digital signal processing systems is the precision of analog to digital conversion. Precision analog to digital conversion has application in fields such as speech-processing, ISDN, digital audio tapes, digital radio, modems, compact disc players, sonar signal processing, and other fields involving signal acquisition and processing. In many of these applications the performance of an analog to digital converter represents the fundamental limit for the operation of the system as a whole. Recently, "delta-sigma modulators" have received considerable attention as candidates for high-resolution analog to digital conversion. Delta-sigma modulators offer high resolution without the component matching required for successive-approximation type analog to digital converters or the restricted speed of integrating converters. Moreover, delta-sigma analog to digital converters fit MOS fabrication trends: they consists largely of digital circuitry, and can therefore scale efficiently in size as digital MOS circuit sizes shrink.

FIG. 1 shows a block diagram of a typical prior art "delta-sigma modulator" 10. As shown in FIG. 1, the prior art delta-sigma modulator consists of integrator 23, analog to digital converter (quantizer) 25, and a digital to analog converter 20 in a feedback loop. An analog input signal x(t) 12 is supplied to the input of delta-sigma modulator 10. Analog input x(t) is sampled at a sampling frequency Fs (14). The sampling frequency Fs is well above the "Nyquist frequency." The Nyquist frequency is defined as a sampling frequency which is twice the highest frequency of the frequency components present in input signal x(t). Digital filter 30 is coupled to the output of quantizer 25 and functions as "decimator" 31. "Decimation" is the name given to processes that lower the sample rate of digitally encoded signals which are sampled at a frequency above their Nyquist rate. In order to prevent out of band signals from aliasing into the baseband of interest, decimation is performed only after the out of band signals are adequately attenuated by digital filter 30. If some of the quantization noise generated by the delta-sigma modulator at y(nT) 28 is in the frequency range that is not of interest, then the resolution of the analog to digital converter can be increased with filtering and decimation. A digital decimation filter can be realized in several ways. For example, FIR filters have been used as decimation filters in delta-sigma modulators.

Analog to digital conversion is a process that necessarily introduces errors into a signal due to quantization. The difference between the output of an otherwise perfect converter (or "quantizer") and that which is expected of a converter with unlimited resolution is called "quantization noise." The level of this "quantization noise" is reduced in converters of higher resolution with finer quantization levels, but nonetheless it remains non-zero. If the analog input is sufficiently random, the spectrum of the quantization noise can be approximated as white, with its energy spectrum equally distributed between zero and Fs, where Fs is the sampling rate. The effective resolution of a converter can be increased by filtering its output and thereby reducing the level of the quantization noise. A commensurate reduction in the available signal bandwidth is a consequence of the filtering, but may be acceptable if the sampling and conversion rates are high. The sampling and conversion of a signal at a rate much higher than the signal frequency is a technique termed oversampling. The oversampling ratio is the ratio of the actual sampling rate to the Nyquist rate.

In operation, the prior art delta-sigma modulator 10 receives an analog input signal denoted as x(t) 12. Input signal x(t) is sampled at a rate much higher than the Nyquist rate. The oversampling of input signal x(t) results in a high resolution of the final output 32 which is typically converted to the much lower Nyquist rate with the aid of decimator 31. Output y(nT) 28 is a one-bit output which is a pulse density representation of the input x(t). The one-bit output y(nT) is digitally filtered by decimator 31 to reduce the high frequency quantization noise produced by quantizer 25 (while leaving the base band unaffected). Digital to analog converter 20 is also a one-bit converter. The output of digital to analog converter is subtracted from the analog input signal x(t). This results in an error signal which is integrated by integrator 23. The resulting signal is "quantized" (i.e. converted) by one-bit analog to digital converter 26. The one-bit quantization performed by modulator 10 generates a high level of quantization noise.. This quantization noise is spectrally shaped by the integrator and feedback loop of the modulator such that most of the noise energy at output 32 lies at high frequencies outside the baseband (i.e., the frequency band of interest).

Although delta-sigma modulators do not typically have good response at DC, when averaged over a large number of outputs they can have excellent theoretical low frequency response. The prior art delta-sigma modulators have a disadvantage when the DC value of an input must be measured. Unwanted offsets present within the delta-sigma modulator can not be distinguished from the DC value of the input.

Analog techniques for correcting and reducing offsets (chopper stabilization, etc.) are typically very difficult to implement and have shown limited success. Another method of offset correction averages (filters) the output over a long period of time and subtracts this value from the input. While this is effective at removing the DC component it precludes the measurement of the DC value. This is because it removes both the DC offset of the modulator and the DC value of the signal.

Phase shifting a signal is desirable in many applications. For a given frequency, a delay in time will correspond to a particular phase shift. At the output of the FIR filter 32 the time interval between samples has been increased due to decimation. By time shifting at the output of the delta-sigma modulator (y(nT) 28) a fine adjustment in the phase of a signal can be made with simple delay elements (flip-flops).

This is adequate for some applications, however a problem arises when a single delta-sigma modulator is multiplexed among multiple input channels and each channel requires different phase adjust. Cross talk between successive channels results whenever phase shifts between successive channels are not equal. This is because data stored in the phase adjusting flip-flops from a previous channel will be used for the present channel.

The present invention overcomes the disadvantages of the prior art delta-sigma modulators. The invention results in DC offset and fine phase correction for delta-sigma modulators. The invention also results in a simple and low cost method for DC offset and fine phase correction. Accordingly, the invention allows use of delta-sigma modulators in precision DC applications where small DC offsets are required.

SUMMARY OF THE INVENTION

The present invention discloses method and apparatus for offset and phase correction in delta-sigma modulators. According to the invention, offsets of the delta-sigma modulator and phases of input signals to delta-sigma modulators are corrected by a simple and low cost method. The invention utilizes a novel switching technique during different sampling periods to eliminate the effect of DC offsets. The invention also uses a delay introduced by a FIFO or a shift register to individually correct for phase shifts present in individual multiplexed input signals. The invention accomplishes these objectives without introducing a significant quantization noise, and without requiring overlapping FIR decimation filters.

BRIEF DESCRIPTION OF THE DRAWINGS

FIGS. 4A–4C show the frequency response of a $Sinc^3$ FIR filter of length N.

FIG. 5 shows the multiplexing of an FIR filter between channels 1, 2, and 3 of input signals to the invention's multiplexed offset and phase correction delta-sigma modulators.

FIG. 6 shows another embodiment of the offset correction delta-sigma modulator of the present invention.

FIG. 7A shows a switched capacitor integrator used in the embodiment of the invention shown in FIG. 6.

FIG. 7B shows another switched capacitor integrator used in the embodiment of the invention shown in FIG. 6.

DETAILED DESCRIPTION OF THE PRESENT INVENTION

Method and apparatus for offset and phase correction for multiplexed delta-sigma modulators are described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

Figure 2:
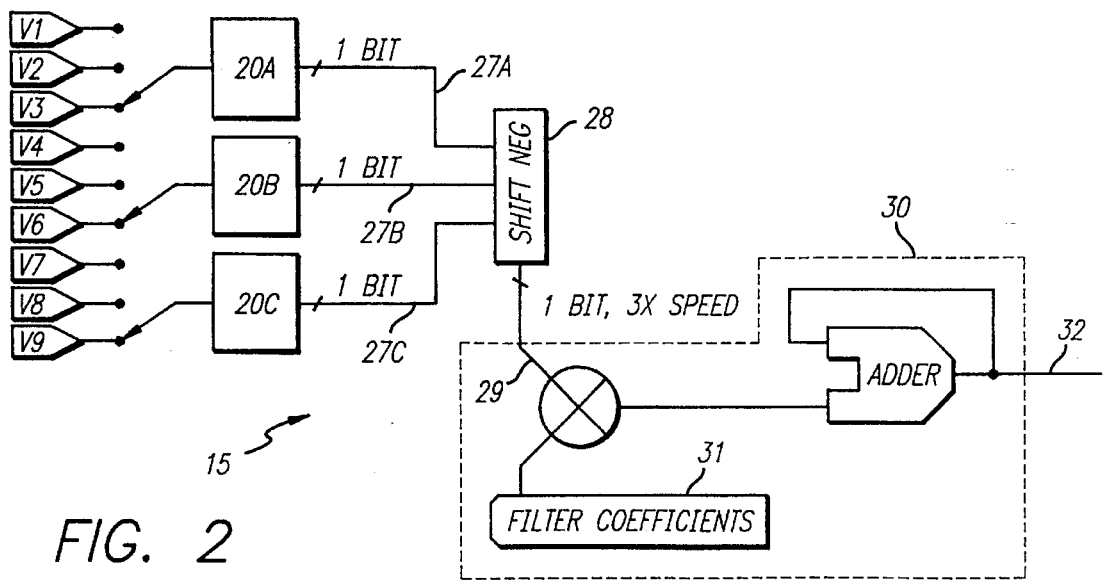
FIG. 2 illustrates the invention's multiplexed offset and phase correction delta-sigma modulators.

FIG. 2 shows an overview of the present invention in block diagrams. As shown in FIG. 2, analog input voltages V1, V2, and V3 are multiplexed and fed to "offset correction delta-sigma modulator" 20A of the present invention. Similarly, analog input voltages V4, VS, and V6 are also multiplexed and fed to another "offset correction delta-sigma modulator" 20B. Likewise, analog input voltages V7, V8, and V9 are multiplexed and fed to a corresponding "offset correction delta-sigma modulator" 20C. A detailed description of the structure and operation of offset correction delta-sigma modulator 20 of the present invention is given below in relation to FIG. 3.

FIG. 2 shows each of the invention's offset correction delta-sigma modulators 20A, 20B, and 20C as providing a one-bit output stream at a high output rate of, for example, 10 MHz. The one-bit output streams are designated as 27A, 27B, and 27C, corresponding to offset correction delta-sigma modulators 20A, 20B, and 20C, respectively. Shift register 28 is coupled to outputs 27A, 27B, and 27C. Output of shift register 28 is a one-bit output 29 which is coupled to a multi-stage Finite Impulse Response (FIR) filter 30. A hardware FIR filter coefficient generator 31 is a part of FIR filter 30 and sets the FIR filter coefficients for proper operation. Output of FIR filter 30 is output 32 which is also the output of multiplexed offset and phase correction delta-sigma modulator 15 of the present invention.

By way of overview, in operation (and focusing on a representative offset correction delta-sigma modulator, for example, delta-sigma modulator 20A), input voltages V1, V2, and V3 are multiplexed and provided to delta-sigma modulator 20A. Thus, delta-sigma modulator 20A is used to convert three independent analog inputs V1, V2, and V3 into respective digital values multiplexed on output 27A. The output of a delta-sigma modulator, such as delta-sigma modulator 20A, is a one-bit stream of data representing an analog input signal and quantization noise. The quantization noise is shaped by delta-sigma modulator 20A so that the resulting noise is small in the band of interest, and is large outside the band of interest. According to the invention, delta-sigma modulator 20A is equipped with a novel mechanism for offset correction. The offset-corrected output 27A of delta-sigma modulator 20A is passed on to shift register 28. Shift register 28 acts as a FIFO which will impose a phase correction on output 27A. FIR filter 30 filters (reduces) the quantization noise at output 29 of shift register 28. By digitally filtering (i.e., "shaping") the one bit data stream, the out of band frequency noise is reduced, leaving only a small in-band noise. FIR filter 30 also causes the data rate at output 32 to be reduced (i.e., "decimated") to the Nyquist rate.

Figure 3:
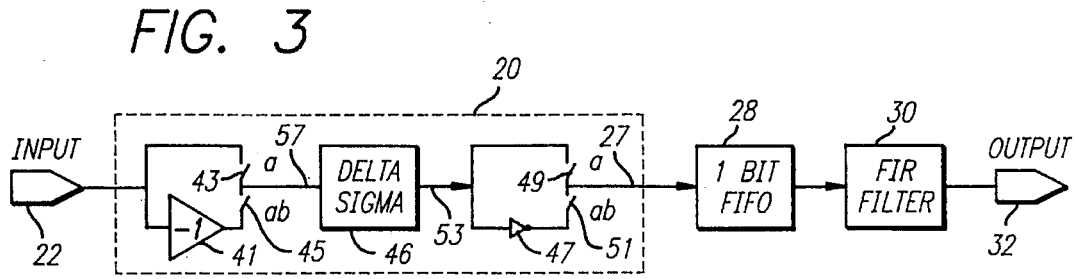
FIG. 3 illustrates the invention's individual offset: and phase correction delta-sigma modulator.

Now the operation of offset correction delta-sigma modulators 20A, 20B, and 20C is discussed in more detail (while the discussion is still focused on a representative delta-sigma modulator, for example delta-sigma modulator 20A). FIG. 3 illustrates offset correction delta-sigma modulator 20 of the present invention. The offset correction delta-sigma modulator 20 comprises a "negative unity gain" amplifier 41, switches 43 and 45, a conventional delta-sigma modulator 46, an inverter 47, and switches 49 and 51. Offset correction delta-sigma modulator 20 receives input 22, and provides an output 27 to a next stage.

Conventional delta-sigma modulator 46 outputs a one bit data stream on output 53. This one bit data stream is representative of the input signal plus quantization noise. The one bit data stream is then digitally filtered by FIR filter 30 to reduce quantization noise. FIR filter 30 also reduces the data rate and thus acts as a decimator. Typically, FIR filter 30 utilizes a weighted sum of N samples. Implementation of an FIR filter of length N is well known in the art and is thus not described in detail in this application. By properly choosing the weighting function (i.e., the function that determines the coefficients of the impulse response of FIR filter 30), and determining filter length N, the quantization noise is reduced to the desired level. The transfer function of FIR filter 30 is typically a Sinc function of order M. The transfer function of a first order Sinc filter is defined by H(f) in equation (17), the transfer function for a second order Sinc filter is defined by H(f) in equation (2), the transfer function for a third order Sinc filter is defined by H(f) in equation (3), and the transfer function for an Mth order Sinc filter is defined by H(f) in equation (4).

$$|H(f)| = \left| \frac{\sin(\pi f N)}{\sin(\pi f)} \right| \quad (1)$$

$$|H(f)| = \left| 2* \frac{\sin(\pi f N/2)}{\sin(\pi f)} \right|^2 \quad (2)$$

$$|H(f)| = \left| 3* \frac{\sin(\pi f N/3)}{\sin(\pi f)} \right|^3 \quad (3)$$

$$|H(f)| = \left| M* \frac{\sin(\pi f N/M)}{\sin(\pi f)} \right|^M \quad (4)$$

According to the invention, typically a Sine³ function is used for the FIR filter (shown as H(f) in equation (3)) when a second order delta-sigma is used. Thus, according to the invention M is typically equal to 3. Additional FIR filtering may be applied to further reduce the quantization noise. However, such additional filtering is typically unnecessary according to the invention. FIR filter 30 removes quantization noise from frequency bands of interest and also decimates the data rate at output 32. As an example, if the decimation factor is Z, the data rate at output 32 is 1/Z times the data rate at input 22. Typically the amount of decimation allowed is determined by the length of the filter (N) divided by the order of the Sinc function. For example, the present invention typically uses an FIR filter of length 288, and a Sinc³ function. Accordingly, the decimation allowed would be 288/3=96. Further decimation shifts the out of band noise into the band of interest. However, since the noise has been sufficiently attenuated by FIR filter 30, the noise shifted into the band of interest would be insignificant, therefor further decimation is allowed.

If N and M are made sufficiently large, for example if N is equal to 288 and M is equal to 3, the integral of the noise from a frequency of zero to the sampling frequency (Fs) is small enough to result in an acceptable signal to noise ratio (SNR). In that case, higher decimation rates do not cause a significant a reduction in signal to noise ratio. This is because all the noise is shifted into the final bandwidth and thus as the bandwidth decreases the integral of the noise remains constant, although the level of the noise increases at a given frequency. Accordingly, a decimation rate larger than N/M is allowed, meaning that the FIR filters used in the invention can be "non-overlapping." "Non-overlapping" FIR filters allow multiplexing offset correction delta-sigma modulator 20 for multi-channel analog to digital conversion. "Non-overlapping" FIR filters also allow for simpler hardware implementation. A first N samples are used in modulating a first input signal for example, V1 in FIG. 2. A second N samples are used in modulating a second input signal, for example V2 in FIG. 2. Likewise, a third N samples are used in modulating a third input signal, for example V3 in FIG. 2. This process is repeated for input signals V1, V2, and V3. For example, if as shown in FIG. 2, only three channels are being multiplexed, the fourth N samples are used in modulating the first input signal, namely V1, and so on.

The output of a delta-sigma modulator is highly uncorrelated to its integrator's initial value. Accordingly, it is practicable to multiplex a delta-sigma modulator even though the initial value of the modulator's integrator is based on the prior channel's input signal. The correlation between the output of the delta-sigma modulator and the modulator integrator's initial value is very small and is further decreased as time increases. The weighting function of the FIR filter reduces the effect of initial values from the modulator, thus further decreasing the effect of the initial value of the integrator.

FIG. 3 illustrates how the offset correction is accomplished according to the present invention. The offset correction method of the invention averages two inputs during a two-step process to correct for the DC offset and arrive at a final output. During a first step, input signal 22 is sampled N times and the N samples are passed through to FIR filter 30 to result in a first output signal O1. During a second step, input signal 22 is passed through negative unity gain amplifier 41 whose output signal is passed to conventional delta-sigma modulator 46. Output 53 of delta-sigma modulator 46 is inverted before being passed to FIR filter 30 to result in a second output signal O2. The first and second output signals (O1 and O2) are added and then divided by two. This will eliminate the effect of the DC offset at input signal 22.

The following discussion further illustrates how the above offset elimination scheme of the present invention operates. The output signal at output 32 for the first N samples of an input signal, for example V1, is obtained by processing the input signal V1 through delta-sigma modulator 46 while switch 43 (designated by "a") is closed and switch 45 (designated by "ab") is open. Output 53 of delta-sigma modulator 46 is passed through closed switch 49 (designated by "a") while switch 51 (designated by "ab") is open. Each bit in the output bit stream is now a representative of analog input signal V1 which can be simplistically represented as:

$$O1 = A*V1 + Voff \quad (5)$$

This equation indicates that during the first N samples (when switches 43 and 49 are closed, and switches 45 and 51 are open) first output signal O1 can be expressed as input voltage V1 times a gain A added to the offset voltage Voff present at the input terminal 57 of delta-sigma modulator 46. During the next N samples of input V1, the output signal at output 32 is determined by processing the input signal V1 through delta-sigma modulator 46 while switch 43 (designated by "a") is open and switch 45 (designated by "ab") is closed. Output 53 of delta-sigma modulator 46 is passed through closed switch 51 (designated by "ab") while switch 49 (designated by "a") is open. Accordingly, each bit in the output bit stream is now a representative of analog input signal V1 which can be simplistically represented as:

$$O2 = A*V1 - Voff \quad (6)$$

This equation indicates that during the second N samples (when switches 43 and 49 are open, and switches 45 and 51 are closed) second output signal O2 can be expressed as input voltage V1 times the gain A less the offset voltage Voff present at the input voltage V1. Adding the first output signal O1 resulted from the first N samples and the second output signal O2 resulted from the second N samples, the final output is obtained as follows:

$$\text{Final Output} = (A*V1 + Voff + A*V1 - Voff)/9\ 2 = A*V1 \quad (7)$$

As shown in equation (7), the effect of input offset voltage Voff is eliminated without disturbing the desired output signal.

The phase correction of the present invention operates as follows. One-bit FIFO 28 in FIG. 3 (shown as shift register 28 in FIG. 2) at output of offset correction delta-sigma modulator 20 of the invention can be used to correct the phase of all the channels multiplexed on the modulator. For example, a one-bit FIFO (shown as shift register 28 in FIG.

2) can be used for phase correction of the three channels of modulator 20A (FIG. 2) multiplexing three input voltages V1, V2, and V3. However, this would not allow independent phase correction. For example, correction of phase of input signal V1 by a certain delay introduced by FIFO 28 causes the same amount of phase correction to be imposed on input signal V2. However, the phase correction required for input signal V2 may be different from that required for input signal V1. Thus, phase correction for each individual input signal V1 and V2 would ordinarily require two separate FIFO's and further two separate delta-sigma modulators, with each delta-sigma modulator giving its output to one of the FIFO's. However, according to the invention, a dead zone of length L (i.e., L sampling cycles) is imposed to separate the multiplexing of the different input voltages. This allows the N samples required for the FIR filter to be taken anywhere over the allotted time permitted for N+L samples. This in turn allows a phase correction up to L delay cycles without causing any overlap of phase correction.

The offset and phase correction of the invention can be simultaneously applied to an input. For example, for the first N+L samples, switches 43 and 49 (both designated by "a") are closed while switches 45 and 51 (both designated by "ab") are open. This causes a positive input to, and a positive output from conventional delta-sigma modulator 46. One-bit FIFO 28 is set to cause some delay in the signal at output 27 of offset correction delta-sigma modulator 20. This delay is set to an amount between O and L sampling cycles. If offset correction is not desired, switches 43 and 49 remain closed during all sampling periods and only the phase of the input signal is corrected by a delay of a length between 0 and L introduced by one-bit FIFO 28. If, in addition to phase correction, offset correction is also required, the next time the input voltage is sampled, switches 45 and 51 will be closed while switches 43 and 49 will be open. This will feed a negative of the input voltage to conventional delta-sigma modulator 46. This will also invert output 53 of delta-sigma modulator 46. As before, one-bit FIFO 28 is set to a delay of a length between O and L as desired. By adding the output resulted from a switch "a" closed position to a switch "ab" closed position and dividing the sum by two, the effect of offset at the input of the invention's offset correction delta-sigma modulator 20 will be nulled. In this case, both offset correction and phase correction are achieved at once.

Turning to proper set up of FIR filter 30 (shown in both FIG. 2 and FIG. 3), a specific example of multiplexing three independent analog input signals V1, V2, and V3 by the invention's offset correction delta-sigma modulator 20A is now discussed. To perform the desired decimation, the invention uses a Sinc$^3$ FIR filter. As discussed above, the resulting decimation in this case is equal to N/3 if N is the length of the FIR filter. The time domain response of a Sinc$^3$ FIR filter is shown in FIG. 4A. The overlapping filters required for decimation by N/3 are shown in FIG. 4B. If the length of FIR filter 30 of the present invention is equal to 288, then the resulting RMS ("Root Mean Square") value of the quantization noise (integrated from a frequency of zero to sampling frequency Fs) at the output of FIR filter 30 results in a theoretical maximum signal to noise ratio (SNR) of approximately 93 dB. For many applications this signal to noise ratio is acceptable. Accordingly, after a decimation of 288/3 by FIR filter 30 no further decimation is required (assuming the frequency domain response is acceptable). The sum of the time domain response shown in FIG. 4B is the frequency domain response shown in FIG. 4C. As shown in FIG. 4C, the frequency response of FIR filter 30 having a length of 288 is relatively flat and then drops abruptly.

When the invention operates as a multiplexed delta-sigma modulator, FIR filter 30 is first run on 288 input samples of an input voltage, for example V1, to result in a first output bit representing V1. The next 288 samples of the FIR are obtained from a different input voltage, for example V2, to result in a second output bit representing V2. Still, the next 288 samples of the FIR are obtained from a different input voltage, for example V3, to result in a third output bit representing V3. Thus, as shown in FIG. 5, FIR filter 30 is multiplexed between channels 1, 2, and 3 of each of the invention's offset correction delta-sigma modulators 20A, 20B, and 20C.

In another embodiment of the present invention, offset correction delta-sigma modulator 20 of FIG. 3 can be implemented as shown in FIG. 6. In this embodiment, delta-sigma modulator 56 internally performs the inversion that was accomplished by negative unity gain amplifier 41 of FIG. 3. As shown in FIG. 6, invert command "ab" 58 is fed to delta-sigma modulator 56. When invert command "ab" 58 is high, an inversion is performed internally in delta-sigma modulator 56. In that case, switch "ab" 51 is closed and switch "a" 49 is open. Accordingly, the state of output signal 27 of offset correction delta-sigma modulator 20 of FIG. 6 is equivalent to the state of output signal 27 of offset correction delta-sigma modulator 20 of FIG. 3 when switches "ab" 45 and "ab" 51 were closed and switches "a" 43 and "a" were open. Referring back to FIG. 6, when invert command "ab" 58 is low, no inversion is performed internally in delta-sigma modulator 56. In this case, switch "a" 49 is closed and switch "ab" 51 is open. Thus, the state of output signal 27 of offset correction delta-sigma modulator 20 of FIG. 6 is equivalent to the state of output signal 27 of offset correction delta-sigma modulator 20 of FIG. 3 when switches "ab" 45 and "ab" 51 were open and switches "a" 43 and "a" 49 were closed.

FIG. 7A shows a switched capacitor integrator that can provide the inversion required for the delta-sigma modulator 56 of the embodiment of the invention shown in FIG. 6. Signals Ø1 and Ø2 are non-overlapping clock signals provided to the switches of the switched capacitor integrator as shown in FIG. 7A. FIG. 7B shows another switched capacitor integrator that can provide the inversion required for the delta-sigma modulator 56 of the embodiment of the invention shown in FIG. 6. Signals Ø1, Ø2, ØX, and Øy are clock signals provided to the switches of the switched capacitor integrator as shown in FIG. 7B. The switched capacitor integrator of FIG. 7B can produce both an inverting or a non-inverting output depending on whether the input signal INV is a "0" or a "1". This INV signal is equivalent to invert command "ab" 58 shown in FIG. 6. The switched capacitor integrator of FIG. 7B can be used instead of negative unity gain amplifier 41 to provide the required inversions for offset correction in the present invention.

Figure 1:
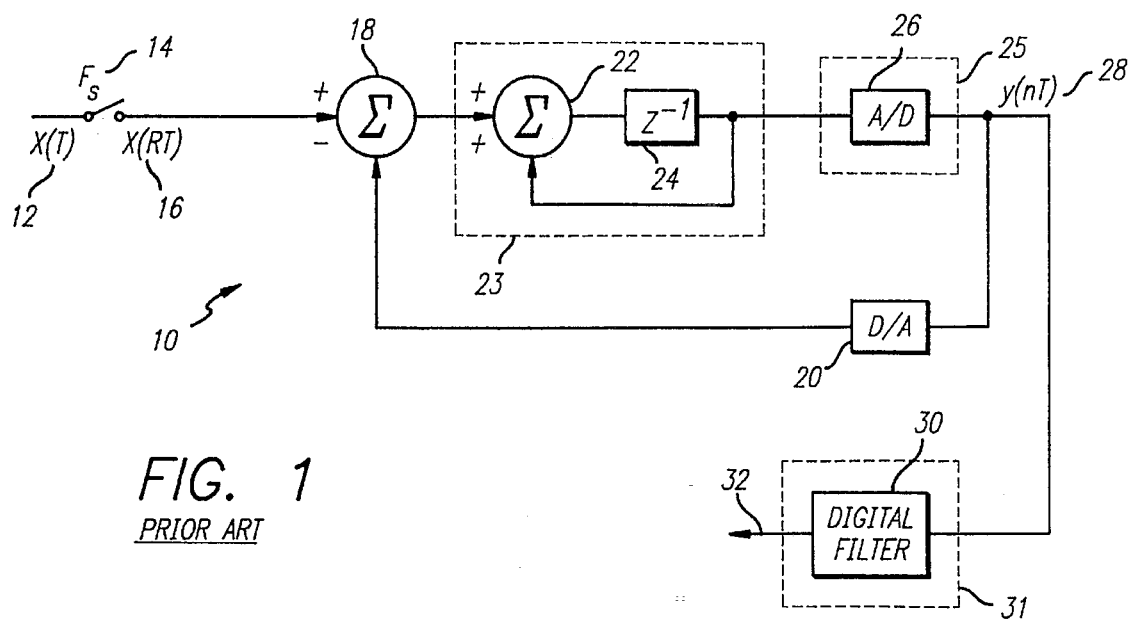
FIG. 1 illustrates a prior art delta-sigma modulator.

The embodiment of the invention shown in FIG. 6 has an advantage of simple implementation and the elimination of gain and offset errors introduced from negative unity gain amplifier 41 of FIG. 3. As shown in FIG. 1, a delta-sigma modulator is made from one or more integrators connected with a feedback path from the output. The use of the switched capacitor integrators shown in FIGS. 7A and 7B allows the inversion with unity gain to be incorporated within the integrator itself. This results in the advantages stated above.

The averaging of two samples to eliminate DC offset can be accomplished in many ways. Averaging is a type of filtering. More complex filtering is possible, and even desirable in many applications. Filtering functions are well known to those skilled in the art, and will not be discussed here in detail.

As shown in FIG. 2, each of the offset correction delta-sigma modulators 20A, 20B, and 20C of the present invention are multiplexed between three channels. For example, modulator 20B is multiplexed between V4, V5, and V6 as shown in FIG. 2. A single FIR filter 30 is used for all three modulators. This results in nine channels of high resolution analog to digital conversion using a very small area. According to the invention, in order to handle the data from modulators 20A, 20B, and 20C, FIR filter 30 runs three times as fast as each of the delta-sigma modulators. Also, sampling frequency Fs is set as three (use of third order Sinc "non-overlapping" FIR filters) times three (the number of channels multiplexed per modulator) times the sampling frequency otherwise used (for non-multiplexed, overlapping FIR filters). Furthermore, the invention does not require overlapping FIR filters to handle the multiplexing of the modulators. The invention results in no increase in the quantization noise. As explained above, the present invention overcomes the disadvantages of the prior art multiplexed delta-sigma modulators. The invention results in DC offset and phase correction for multiplexed delta-sigma modulators. The invention also results in a simple and low cost method for DC offset and phase correction. Accordingly, the invention allows use of delta-sigma modulators in precision DC applications where small DC offset and phase corrections must be made.

Although the invention has been described with reference to a preferred embodiment, it is appreciated by those skilled in the art that changes in various details may be made without departing from the invention defined in the appended claims. Thus, offset and phase correction method and apparatus for delta-sigma modulators have been described.

We claim:

1. An offset and phase correction delta-sigma modulator comprising:

a first input having a phase;

a first switch coupled to said first input, said first switch being coupled to an input of a delta-sigma modulator, said input of said delta-sigma modulator having a first DC offset;

a second switch coupled to an output of a negative unity gain amplifier an input of said negative unity gain amplifier being coupled to said first input, said second switch being coupled to said input of said delta-sigma modulator;

an inverter coupled to an output of said delta-sigma modulator;

a FIFO coupled to a third switch, said third switch being coupled to said output of said delta-sigma modulator;

said FIFO being coupled to a fourth switch, said fourth switch being coupled to an output of said inverter;

an FIR filter coupled to an output of said FIFO, an output of said FIR filter providing an offset and phase corrected output for said offset and phase correction delta-sigma modulator;

said first, second, third and forth switches opening and closing during sampling of said first input.

2. The offset and phase correction delta-sigma modulator of claim 1 wherein during a first N samples of said first input said first and third switches are closed and said second and fourth switches are open; wherein during said first N samples a first output proportional to said first input minus said first DC offset is generated.

3. The offset and phase correction delta-sigma modulator of claim 2 wherein during a second N samples of said first input said first and third switches are open and said second and fourth switches are closed; wherein during said second N samples a second output proportional to said first input minus said first DC offset is generated.

4. The offset and phase correction delta-sigma modulator of claim 3 wherein said first DC offset is corrected by determining a sum of said first and second outputs and dividing said sum by two.

5. The offset and phase correction delta-sigma modulator of claim 1 wherein said FIFO causes a delay to correct said phase.

6. The offset and phase correction delta-sigma modulator of claim 5 wherein said FIFO causes a delay of a plurality of sampling cycles.

7. A mulfiplexed offset and phase correction delta-sigma modulator comprising:

a first plurality of inputs multiplexed to a negative unity gain amplifier, each of said first plurality of inputs having a respective phase;

a first switch being multiplexed to said first plurality of inputs, said first switch being coupled to an input of a delta-sigma modulator, said input of said delta-sigma modulator having a first DC offset;

a second switch coupled to an output of a negative unity gain amplifier, said second switch being coupled to said input of said delta-sigma modulator;

an inverter coupled to an output of said delta-sigma modulator;

a FIFO coupled to a third switch, said third switch being coupled to said output of said delta-sigma modulator;

said FIFO being coupled to a fourth switch, said fourth switch being coupled to an output of said inverter; and an FIR filter coupled to an output of said FIFO, an output of said FIR filter providing an offset and phase corrected output for said multiplexed offset and phase correction delta-sigma modulator;

said first, second, third and fourth switches opening and closing during sampling of said first plurality of inputs.

8. The multiplexed offset and phase correction delta-sigma modulator of claim 7 wherein during a first N samples of one of said first plurality of inputs said first and third switches are closed and said second and fourth switches are open; wherein during said first N samples a first plurality of outputs proportional to said first plurality of input plus said first DC offset is generated.

9. The multiplexed offset and phase correction delta-sigma modulator of claim 8 wherein during a second N samples of said one of said first plurality of inputs said first and third switches are open and said second and fourth switches are closed; wherein during said second N samples a second plurality of outputs proportional to said first plurality of inputs minus said first DC offset is generated.

10. The multiplexed offset and phase correction delta-sigma modulator of claim 9 wherein said first DC offset is corrected by determining a sum of said first and second plurality of outputs and dividing said sum by two.

11. The multiplexed offset and phase correction delta-sigma modulator of claim 6 wherein said FIFO causes a delay to correct said respective phase of each of said plurality of inputs.

12. The multiplexed offset and phase correction delta-sigma modulator of claim 11 wherein said FIFO causes a delay of a plurality of sampling cycles.

13. A plurality of multiplexed offset and phase correction delta-sigma modulators, each of said plurality of multiplexed offset and phase correction delta-sigma modulators comprising:

a first plurality of inputs multiplexed to a negative unity gain amplifier, each of said first plurality of inputs having a respective input phase;

a first switch being multiplexed to said first plurality of inputs, said first switch being coupled to an input of a delta-sigma modulator, said input of said delta-sigma modulator having a first DC offset;

a second switch coupled to an output of said negative unity gain amplifier, said second switch being coupled to said input of said delta-sigma modulator;

an inverter coupled to an output of said delta-sigma modulator;

a shift register coupled to a third switch, said third switch being coupled to said output of said delta-sigma modulator;

said shift register being coupled to a fourth switch, said fourth switch being coupled to an output of said inverter; and an FIR filter coupled to an output of said shift register, an output of said FIR filter providing an offset and phase corrected output for said plurality of said multiplexed offset and phase correction delta-sigma modulators;

said first, second, third and fourth switches opening and closing during sampling of said first plurality of inputs.

14. A phase correction delta-sigma modulator comprising:

a first input coupled to a negative unity gain amplifier, said input having an input phase;

a first switch coupled to said first input, said first switch being coupled to an input of a delta-sigma modulator, said input of said delta-sigma modulator having a first DC offset;

a second switch coupled to an output of a negative unity gain amplifier, said second switch being coupled to said input of said delta-sigma modulator;

an inverter coupled to an output of said delta-sigma modulator;

a FIFO coupled to a third switch, said third switch being coupled to said output of said delta-sigma modulator; and said FIFO being coupled to a fourth switch, said fourth switch being coupled to an output of said inverter, wherein a delay forced by said FIFO causes a phase of an output of said FIFO to be less than said input phase;

said first, second, third and fourth switches opening and closing during sampling of said first input.

15. The phase correction delta-sigma modulator of claim 14 wherein during a first N samples of said first input said FIFO forces a delay of a plurality of sampling cycles to cause said phase of said output of said FIFO to be less than said input phase.

16. The phase correction delta-sigma modulator of claim 14 wherein complex filters cause said output of said FIFO to have a second DC offset less than said first DC offset of said input of said delta-sigma modulator.

17. An offset correction delta-sigma modulator comprising:

an input coupled to a negative unity gain amplifier, said input having an input phase;

a first switch being coupled to said first input, said first switch being coupled to an input of a delta-sigma modulator, said input of said delta-sigma modulator having a first DC offset;

a second switch coupled to an output of a negative unity gain amplifier, said second switch being coupled to said input of said delta-sigma modulator;

an inverter coupled to an output of said delta-sigma modulator;

an FIR filter coupled to a third switch, said third switch being coupled to said output of said delta-sigma modulator; and said FIR filter being coupled to a fourth switch, said fourth switch being coupled to an output of said inverter;

said first, second, third and fourth switches opening and closing during sampling of said input.

18. The offset correction delta-sigma modulator of claim 17 wherein during a first N samples of said input signal said first and third switches are closed and said second and fourth switches are open; wherein during said first N samples a first output proportional to said input plus said first DC offset is generated.

19. The offset correction delta-sigma modulator of claim 18 wherein during a second N samples of said input signal said first and third switches are open and said second and fourth switches are closed; wherein during said second N samples a second output proportional to said input minus said first DC offset is generated.

20. An offset correction delta-sigma modulator comprising:

a first input coupled to an input of a delta-sigma modulator, said input of said delta-sigma modulator having a first DC offset;

said delta-sigma modulator including a switched capacitor integrator, an invert command being coupled to said switched capacitor integrator;

an inverter coupled to an output of said delta-sigma modulator;

an FIR filter coupled to a third switch, said third switch being coupled to said output of said delta-sigma modulator; and said FIR filter being coupled to a fourth switch, said fourth switch being coupled to an output of said inverter;

said first second, third and fourth switches opening and closing during sampling of said first input.

21. The offset correction delta-sigma modulator of claim 20 wherein said third switch is open and said fourth switch is closed when said invert command is high.

22. The offset correction delta-sigma modulator of claim 20 wherein said third switch is closed and said fourth switch is open when said invert command is low.

* * * * *